United States Patent
Zhou et al.

(10) Patent No.: US 8,711,524 B2
(45) Date of Patent: Apr. 29, 2014

(54) PATTERNED MR DEVICE WITH CONTROLLED SHAPE ANISOTROPY

(75) Inventors: Yuchen Zhou, San Jose, CA (US); Yimin Guo, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1165 days.

(21) Appl. No.: 12/012,667

(22) Filed: Feb. 5, 2008

(65) Prior Publication Data

US 2009/0195941 A1 Aug. 6, 2009

(51) Int. Cl.
*G11B 5/33* (2006.01)

(52) U.S. Cl.
USPC .......................................... 360/319

(58) Field of Classification Search
None
See application file for complete search history.

(56) References Cited

U.S. PATENT DOCUMENTS

| | | | |
|---|---|---|---|
| 4,847,584 A | 7/1989 | Pant | |
| 5,247,278 A | 9/1993 | Pant et al. | |
| 6,680,829 B2 * | 1/2004 | Chen et al. | 360/319 |
| 6,873,499 B2 | 3/2005 | Lee et al. | |
| 6,980,403 B2 * | 12/2005 | Hasegawa | 360/319 |
| 7,016,166 B1 | 3/2006 | Hou et al. | |
| 7,203,039 B2 | 4/2007 | Wang et al. | |
| 7,283,336 B2 | 10/2007 | Gill | |
| 7,599,151 B2 * | 10/2009 | Hatatani et al. | 360/319 |
| 2002/0030947 A1 * | 3/2002 | Chen et al. | 360/319 |
| 2006/0114617 A1 * | 6/2006 | Nikitin | 360/324.1 |

OTHER PUBLICATIONS

"Effect of interstrip gap in the sensitivity of high sensitivity magnetoresistive transducers," by Bharat B. Pant Journal of Applied Physics, 79(8), Apr. 15, 1996, pp. 6123-6125.

"Factors affecting the performance of a thin film magnetoresistive vector magnetometer," by Hoffman et al., Journal of Applied Physics, 53(11), Nov. 1982, pp. 8266-8268.

"Barkhausen Noise in Thin-Film Recording Heads," by Klassen et al., IEEE Transactions on Magnetics, vol. 26, No. 5, Sep. 1990, pp. 1697-1699.

* cited by examiner

*Primary Examiner* — David D Davis
(74) *Attorney, Agent, or Firm* — Saile Ackerman LLC; Stephen B. Ackerman

(57) ABSTRACT

A magnetic sensor with increased sensitivity, lower noise, and improved frequency response is described. The sensor's free layer is ribbon shaped and is closely flanked at each long edge by a ribbon of magnetically soft, high permeability material. This side pattern absorbs external field flux, concentrating it to flow into the sensor's edges to promote larger MR sensor magnetization rotation.

3 Claims, 7 Drawing Sheets

PATTERNED MR DEVICE WITH CONTROLLED SHAPE ANISOTROPY

FIELD OF THE INVENTION

The invention relates to the general field of magnetic sensors with particular reference to improving their sensitivity, frequency response, and noise level.

BACKGROUND OF THE INVENTION

Magneto-resistive (MR) thin film sensors used for low field sensing applications usually take the form of long stripes with a width of several microns and a length of tens of microns, up to about 100 microns [1]-[3]. With such a large aspect ratio, the shape anisotropy of the long stripe helps to maintain the magnetic domain structure within the sensing layer of the device (which has a thickness of <10 nm in most cases). Prior work [4] also shows that reducing the gap between adjacent stripe patterns can help alleviate the "stiffness" of the sensor caused by the shape anisotropy of the long stripe. Thus, the sensitivity of the multi-stripe sensor array can be improved, as we will discuss below.

A routine search of the prior art was performed with the following additional references of interest being found:

U.S. Pat. No. 7,283,336 (Gill) shows a single-domain free layer having a bias field at side edges of the read sensor. U.S. Pat. No. 7,203,039 (Wang et al—Headway) discloses an additional layer of soft magnetic material abutting hard biasing layers to prevent flux leakage. U.S. Pat. No. 7,016,166 (Hou et al) shows biasing structures abutting each side of the single domain MR structure. U.S. Pat. No. 6,873,499 (Lee et al) shows flux guides abutting the read sensor.

SUMMARY OF THE INVENTION

It has been an object of at least one embodiment of the present invention to provide and MR sensor having a linear response due to uniform rotation of its free layer magnetization.

Another object of at least one embodiment of the present invention has been to provide an MR sensor exhibiting minimal low frequency noise due to its having a single domain free layer Still another object of at least one embodiment of the present invention has been to provide an MR sensor wherein field concentration and demagnetization cancellation by neighboring soft magnetic patterns is not limited by said MR sensor's free layer's properties whereby said free layer can be independently optimized to increase the sensitivity of the MR sensor.

A further object of at least one embodiment of the present invention has been to improve the sensitivity to magnetic fields of said MR sensor.

These objects have been achieved by means of a sensor that has a free layer in the shape of a long ribbon having an aspect ratio greater than about 3 and a width (which coincides with the direction of the field to be sensed) that is less than the exchange length of the free layer material. Said free layer may be part of a AMR, GMR, or TMR device.

Concentration of flux from sources external to the free layer is enhanced by a pair of soft magnetic ribbons located at the sides of the MR sensor in close proximity to the sensor's long edges.

This side pattern acts as a magnetic flux bridge that absorbs field flux, concentrating it to flow into the MR sensor edges to promote larger MR sensor magnetization rotation. For such an effect to work efficiently, high permeability material is preferred. Also, close proximity of the structure to the MR sensor edge, higher moment of the structure material relative to the MR sensor free layer as well as the physical shape of the structure are all factors that help to concentrate the flux.

DESCRIPTION OF THE PREFERRED EMBODIMENTS

Figure 1A:
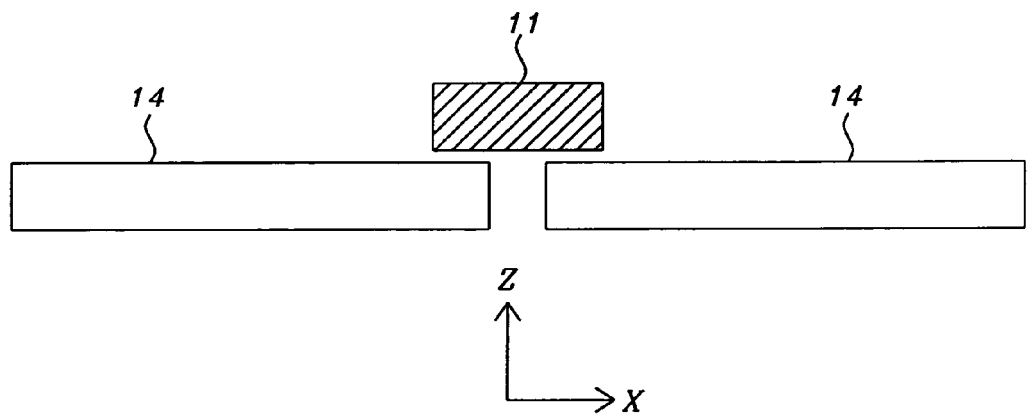
FIGS. 1A and B illustrate the basic principle of the invention and compare the degree of magnetization rotation with and without the presence of patterned soft magnetic material located at the sides of a MR sensor.

Introduction:

Domains in the Free Layer

Due to the large size of the prior art sensing devices, they have a minimum dimension of about 1am. This is much larger than the exchange length of typical free layer material (200 nm-300 nm). Consequently, the presence of domains can be expected in these prior art sensors. To achieve stable and linear response from a MR device, the magnetization response to an external field is preferred to be due to a gradual magnetization rotation of the free layer in the applied field direction as in normal MR sensors used in hard disk drive heads. Magnetization switching through domain movement in the free layer, however, very sensitive to the external field because of the lower energy needed to move a magnetization vortex, it is also intrinsically non-linear and very noisy.

For example, the Barkhausen noise resulted from the domain motion in the presence of the applied field [5] can lead to significant low frequency noise and signal level uncertainty. Thus, although the sensitivity of domain movement is high, the noise that it causes offsets the gain of the high sensitivity and produces an effectively low SNR sensor. For accurate and high sensitivity field sensing, single domain free layer should be the best situation. This requirement will need the minimal dimension of the field sensor, i.e. width of the sensor in most cases, to be shorter than the exchange length of the free layer material. Thus, a sensor width of less than 300 nm would be the most suitable.

Insufficient Demagnetization Field Cancellation

For a high length-over-width aspect ratio sensor, as required for a single domain free layer design, the shape anisotropy along the length direction could be high enough to cause sensitivity loss, especially in the low field case. In a prior study [4], the sensor stripes were arranged closer to each other so that the edge charges from sensors helped to offset the demagnetization field in their neighboring sensors.

Using the neighboring sensor's free layer to offset the demag. field is not a very efficient way to enhance the sensitivity of a stripe type field sensor. The reason is that the MR sensor free layer is usually very thin, which requires very close proximity between the sensors to actually utilize the neighboring charges. For a free layer of 10 nm thickness, the expected proximity should be around the same scale, i.e. 10 nm, which is very hard to manufacture.

Use of adjacent soft material to enhance sensitivity by absorbing the meager flux of the magnetic field to be sensed by the soft material and then re-concentrating that flux in the sensor free layer could theoretically lead to a higher rotation of the free layer's magnetization. To benefit from this flux concentration effect, it is better achieved through some individual neighboring single layer magnetic structures rather than through the MR sensor itself. In this way it will not be limited by the free layer's thickness, magnetic moment, and material properties. Such a single layer structure at the side of the MR sensor can be of uniformly constituted magnetic material having higher moment than the sensor's free layer, as well as high permeability and low coercivity.

REFERENCES

[1] G. Hoffman, and J. Birtwistle, "Factors affecting the performance of a thin film magnetoresistive vector magnetometer," *J. Appl. Phys.*, vol 53, pp. 8266-8268, November 1982.
[2] Bharat B. Pant, "Magnetoresistive magnetic sensor," U.S. Pat. No. 4,847,584 (1989).
[3] Bharat B. Pant, Donald R. Krahn, and Richard B. Fryer, "Magnetic field sensing device," U.S. Pat. No. 5,247,278 (1993).
[4] Bharat B. Pant, "Effect of interstrip gap on the sensitivity of high sensitivity magnetoresistive transducers," *J. Appl. Phys.*, vol 79, pp. 6123-6125, April 2006.
[5] K. B. Klaassen, and J. C. L. van Peppen, "Barkhausen noise in thin-film recording heads," *IEEE Trans. on Magn.*, vol 26, pp. 1697-1699, September 1990.

Invention Details

The invention discloses using a MR sensor in its single domain state without forming domain walls in the sensor's free layer. It is not specifically limited to any one type of MR sensor, but rather any MR sensor with a magnetic free layer. With the single domain, free layer magnetization undergoes uniform rotation in the presence of an external field to produce linear response. Also in the single domain state, various noises of magnetic origin can be effectively eliminated or reduced. However, due to the single domain requirement, the sensor width, which coincides with the direction of the field to be sensed, needs to be less than the exchange length of the free layer material.

An important feature of the invention is the utilization of patterned soft magnetic material located at the sides of the MR sensor in close proximity to the sensor's long edges. This side pattern absorbs external field flux, concentrating it to flow into the MR sensor edges to promote larger MR sensor magnetization rotation. For such an effect to work efficiently, high permeability material is preferred. Also, close proximity of the structure to the MR sensor edge, higher moment of the structure material relative to the MR sensor free layer as well as the physical shape of the structure are all factors that help to concentrate the flux, as will be detailed in the embodiments presented below.

FIGS. 1A&B show a comparison of simulated effective magnetization rotation of the MR sensor free layer along the applied field direction, with and without the neighboring soft magnetic film of the invention.

FIG. 1A shows the sensor structure that was simulated. For simulation purposes, free layer 11 had a width of ~10 μm in the x axis direction, a thickness of 15 nm in z axis direction, and the gap between adjacent free layers in the x axis direction was 200 nm. The neighboring soft magnetic film 14 bridges the gap between the free layers by lying above and between them. It had a width of 700 nm, a thickness of 15 nm, and a spacing between 14's bottom surface and 11's top surface of 30 nm. The materials of 11 and 14 were assumed to be the same soft material with $B_s=1T$.

Figure 1B:
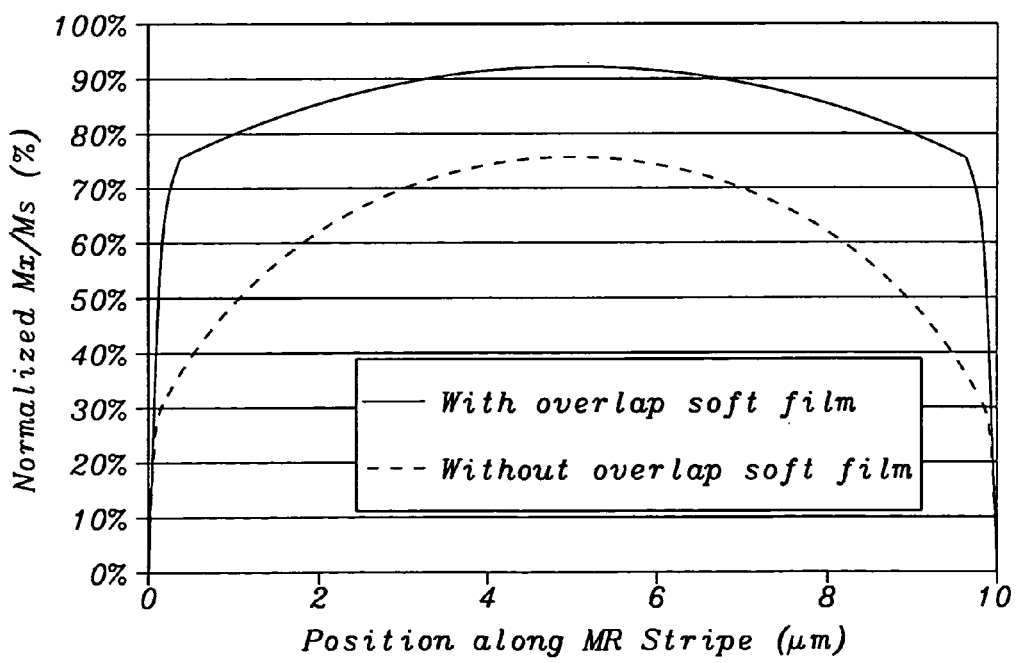

FIG. 1B shows the free layer 11 magnetization component in the x direction vs. the position along the width direction under a 10 Oe field applied in the x direction, with and without the presence of soft film 14. It shows that the added soft film can enhance the magnetization rotation by more than 30%. This clearly demonstrates the advantage of providing a neighboring soft magnetic film to enhance the sensitivity of a MR sensor stripe.

In summary, the major advantages of the invention when using single domain narrow width MR sensors with neighboring soft magnetic patterns include:

1. MR sensor response is more linear due to the uniform rotation of the free layer magnetization
2. Sensor low frequency noise is less due to the single domain free layer
3. Field concentration and demagnetization cancellation by neighboring soft magnetic patterns is not limited by the MR sensor's free layer's properties so can be independently optimized to increase the sensitivity of the MR sensor.

Figure 5A:
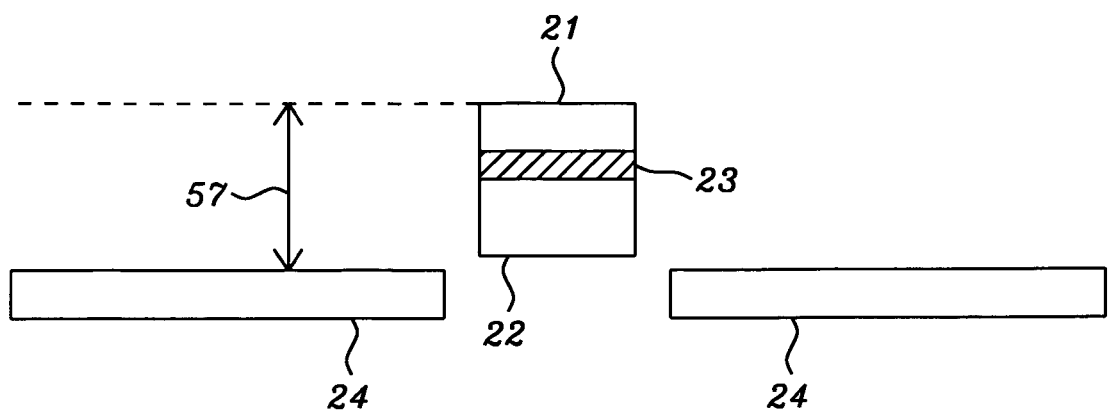
FIGS. 5A, B, and C show an embodiment wherein the full MR device is located above the side stripes, allowing for the possibility of the latter overlapping the former.
Figure 5B:
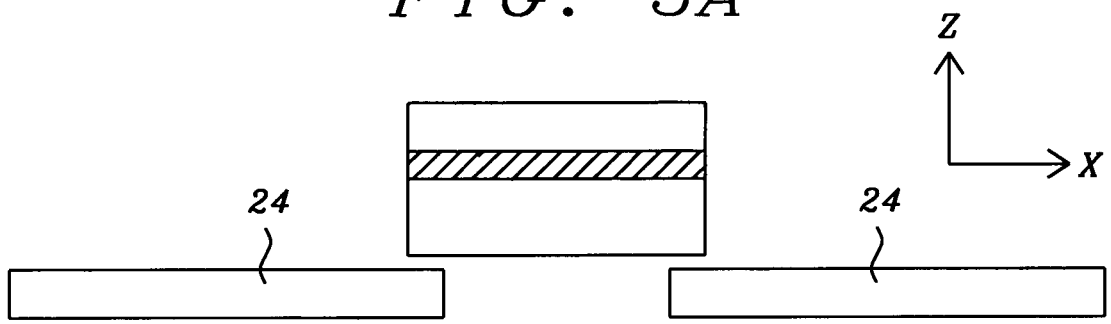
Figure 5C:
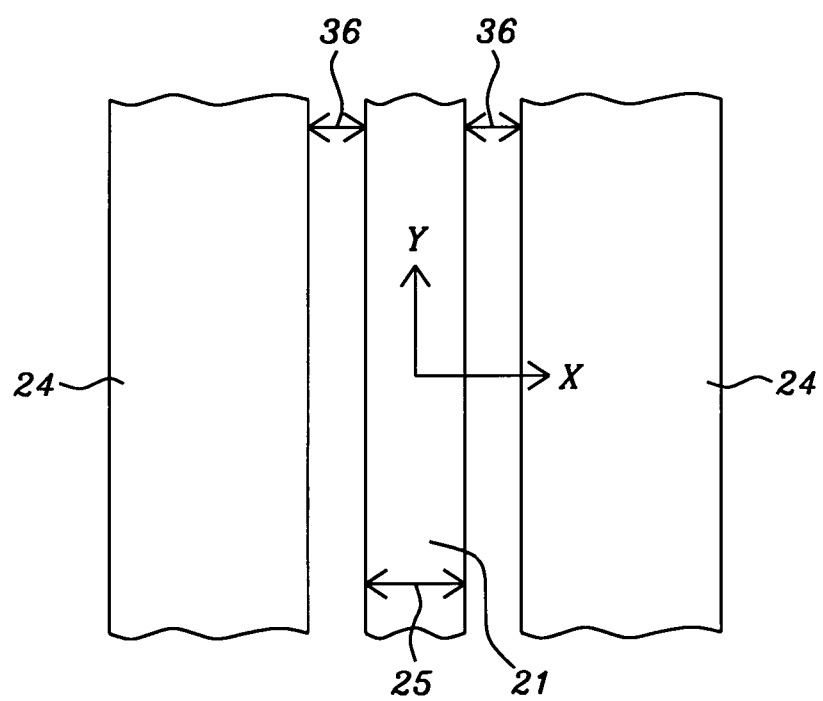
Figure 6A:
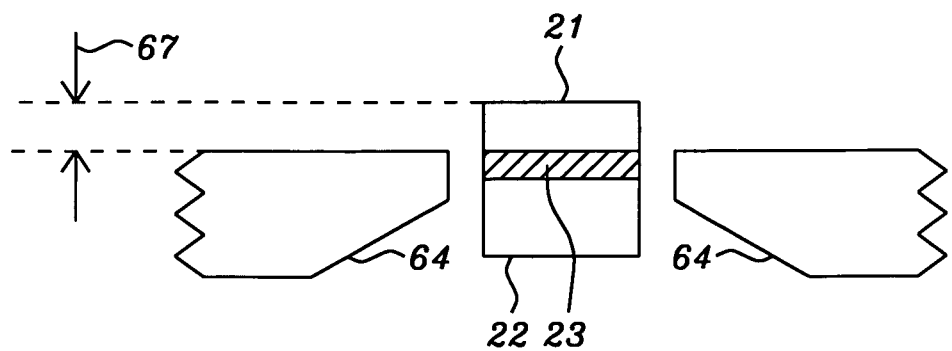
FIGS. 6A, B, and C show an embodiment similar to that shown in FIG. 5 but wherein the side stripes have asymmetrically tapered edges.
Figure 6B:
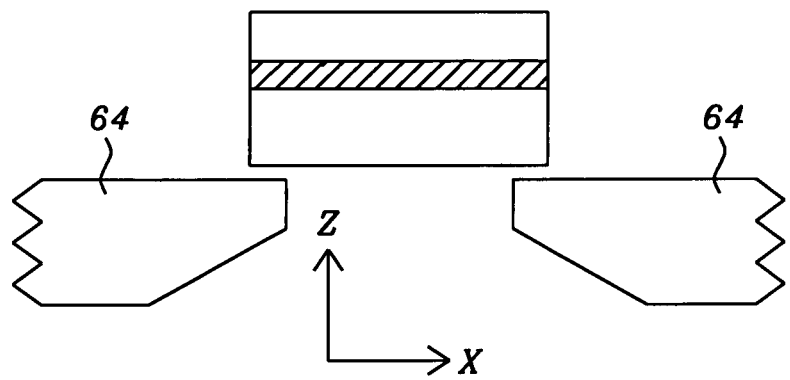
Figure 6C:
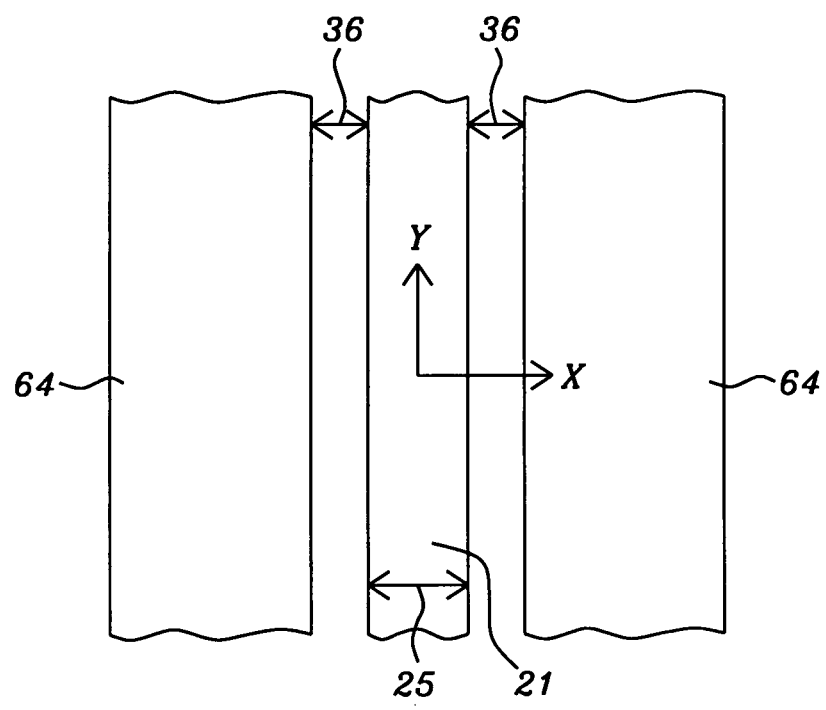

The embodiments described below, that have a soft magnetic pattern on the sides closest to the edges of the free layer, but lying below its top surface (i.e. as shown in FIGS. 5 and 6), can be made using procedures similar to those used for hard bias deposition in the manufacture of hard drive read heads, except that the hard magnetic material is replaced by soft magnetic material.

Embodiment 1

Figure 2A:
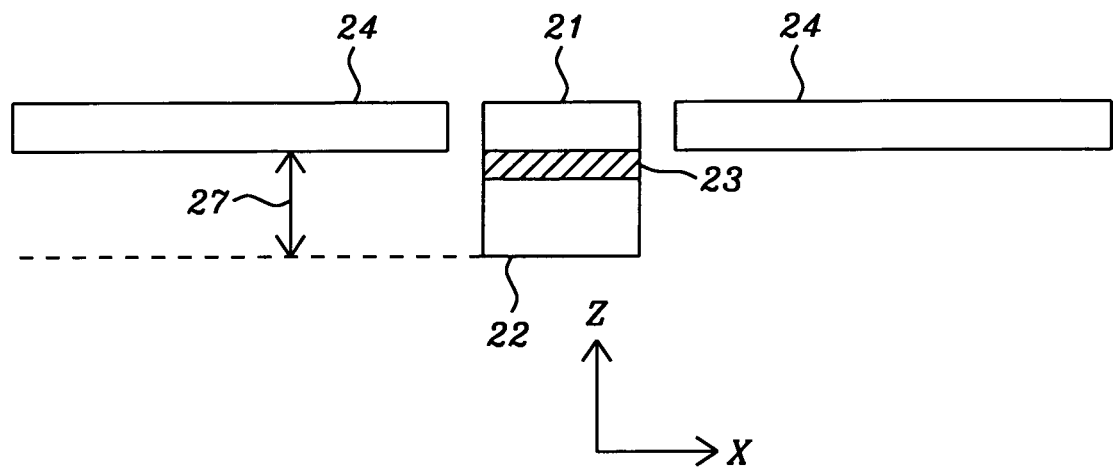
FIGS. 2A and 2B show cross-sectional and plan views, respectively, of an embodiment that represents the simplest form of the invention to implement which allows the side stripes and the free layer to be formed in a single deposition.
Figure 2B:
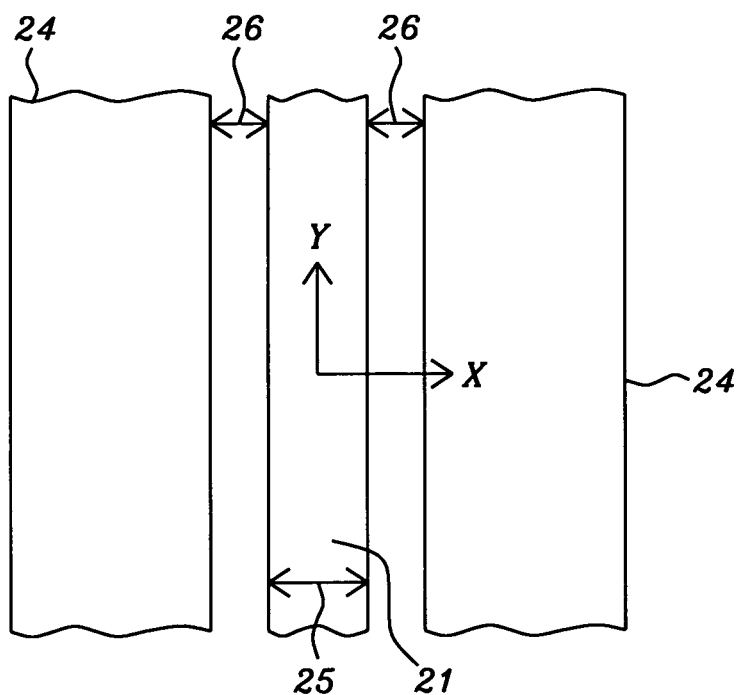

Referring now to FIG. 2A, seen there, in cross-sectional view, are free layer 21, reference (pinned) layer 22, and spacer layer 23 (Cu for GMR (Giant Magneto-Resistance) and metal oxide for TMR (Tunneling Magneto-Resistance) devices) which have been patterned into long stripes. For the AMR (Anisotropic Magneto-Resistance) device case, only layer 21 exists. For the GMR and TMR cases, layer 22's magnetization is pinned in the x direction by other magnetic layers located below it (but not shown). Non-sensing soft magnetic films 24 are patterned and positioned in close proximity to the longer edges of the MR sensor.

The width 25 of free layer 21 is less than the magnetic exchange length of typical free layer material, i.e. <300 nm in most cases. The MR sensor length along the y direction is much longer than width 25 (at least 1 μm). The soft film pattern 24 has a similar, or even greater length than the MR sensor in the y direction. There is no specific width requirement for 24 but it should preferably be wider than 25. The thickness of pattern 24 is close to that of the free layer and relates top it according the inequality of $M_{film}t_{film} > M_{free}t_{free}$, where the M's and t's are the magnetization and thickness of patterned film 24 and free layer 21 respectively.

The spacing between 24 and 21 (designated 26 in the figure) is no greater than twice the larger of these two thicknesses. The vertical distance 27, between pattern 24's bottom surface and the MR sensor stack's bottom surface is such that the vertical distance between the center lines of 21 and 24 is with ±100% of the thickness of 24. Although only a single instance of the side by side arrangement of MR stack and patterned film 24 is shown in the figure, said arrangement can be repeated with a chosen periodicity along the x direction to form multiple MR sensing stripes interleaved with multiple patterned films 24, with neighboring MR stripes sharing a common patterned film 24.

Embodiment 2

Figure 3A:
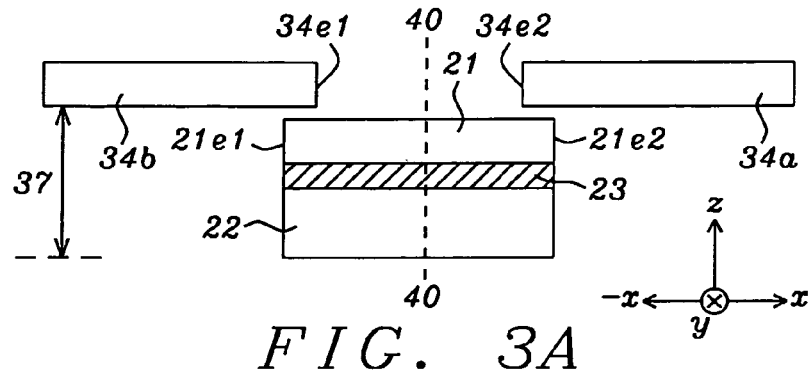
FIGS. 3A, B, and C show an embodiment wherein the free layer is located below the side stripes, allowing for the possibility of the latter overlapping the former.
Figure 3B:
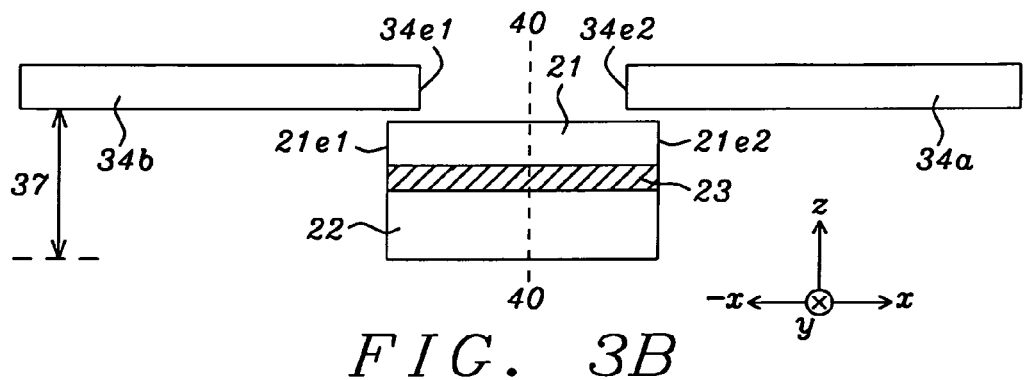
Figure 3C:
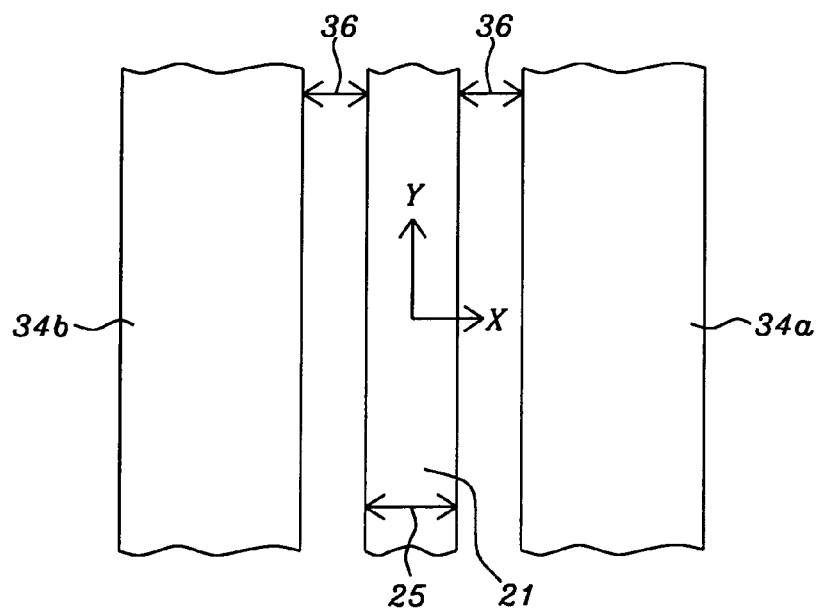

This embodiment, shown in FIGS. 3A, B, &C, is the same as Embodiment 1 except that distance 37 is equal or larger than the MR film stack and pattern 34 comprised of flux absorbing stripes 34a, 34b is entirely above the top surface of free layer 21. The thickness of 34 still satisfies $M_{film}t_{film}>M_{free}t_{free}$. In FIG. 3a, there is a plane 40-40 that bisects the MR stripe including free layer 21 in a lengthwise direction along the y-axis. A second edge 34e2 of a first flux absorbing stripe 34a is offset from a first edge 21e2 of the free layer along the x-axis direction that is orthogonal to plane 40-40. A second edge 34e1 of a second flux absorbing stripe 34b is offset from a first opposing edge 21e1 of the free layer along a (−)x-axis direction. Distance 36 along the x-axis direction in FIG. 3C is preferred to be as close to zero as possible for good magnetostatic coupling between 21 and 34a, and between 21 and 34b. As illustrated in FIG. 3B, distance 36 can even be negative since some overlap between the 21 and 34a edges, and between the 21 and 34b edges is possible, as shown.

Embodiment 3

Figure 4A:
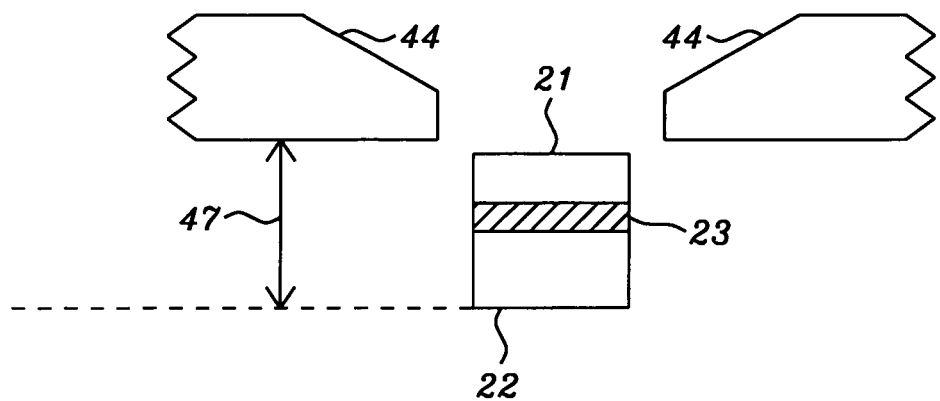
FIGS. 4A, B, and C show an embodiment similar to that shown in FIG. 3 but wherein the side stripes have asymmetrically tapered edges.
Figure 4B:
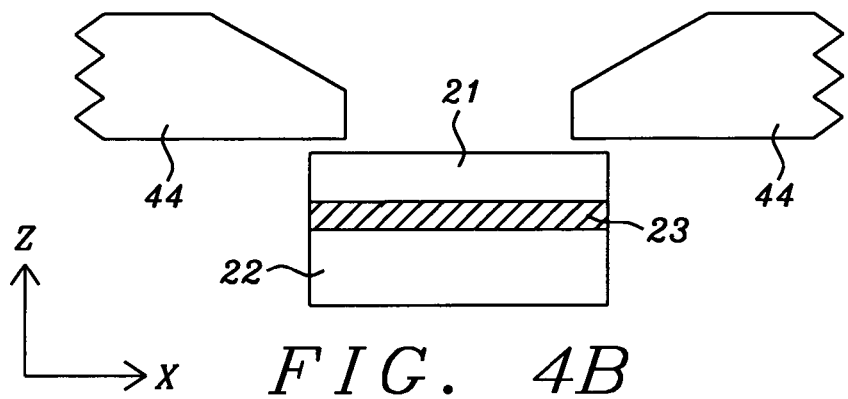
Figure 4C:
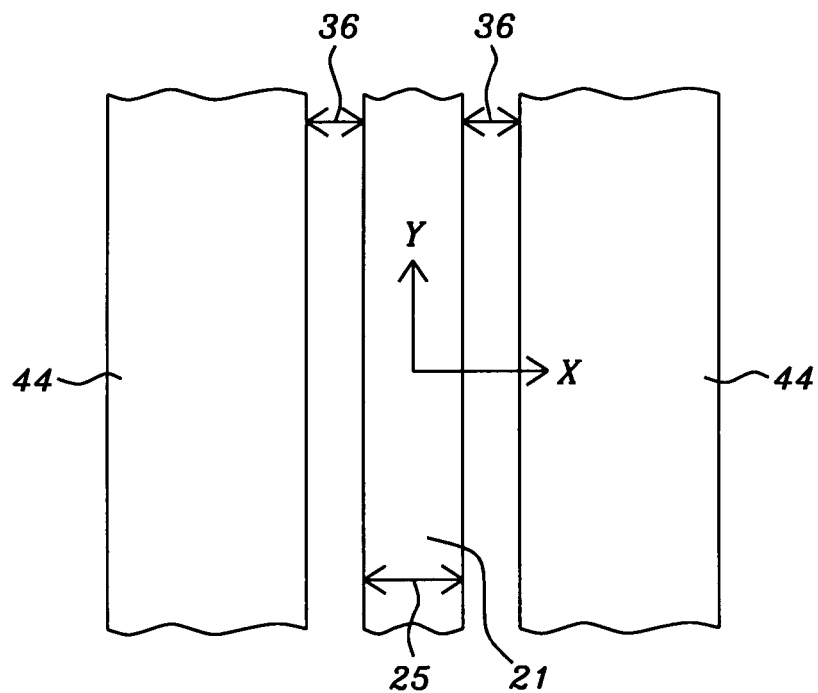

This embodiment, shown in FIGS. 4A,B,&C, is the same as embodiment 1 except that pattern 44 has asymmetrically tapered edges. The latter are thinnest at their point of closest proximity to the MR sensor, growing thicker with distance from pattern 44, in an upward direction (i.e. away from the pattern bottom) until reaching their regular thickness value. Tapering the edges of 44 serves to concentrate flux into free layer 21, thereby increasing its sensitivity to external fields.

Embodiment 4

This embodiment, shown in FIGS. 5A,B,&C, is the same as embodiment 1 except that distance 57 is now the distance between the top surfaces of 21 and 24 and is equal to or larger than the thickness of free layer 21. i.e. pattern 24 is entirely below the bottom surface of free layer 21. The thickness of 24 still satisfies $M_{film}t_{film}>M_{free}t_{free}$. Distance 36 along the x direction is preferred to be as close to zero as possible for good magnetostatic coupling between 21 and 24. As discussed above, distance 36 can be negative, as shown in FIG. 5B where there is a small amount of overlap between the edges of 21 and 24.

Embodiment 5

This embodiment, shown in FIGS. 6A,B,&C, is the same as embodiment 4 except that pattern 64 has asymmetrically tapered edges. The latter are thinnest at their point of closest proximity to the MR sensor, growing thicker with distance from pattern 64, in a downward direction (i.e. away from the pattern top) until reaching their regular thickness value. This tapered pattern 64 helps to concentrate flux into free layer 21, thereby increasing sensor sensitivity to an external field.

Embodiment 6

Figure 7A:
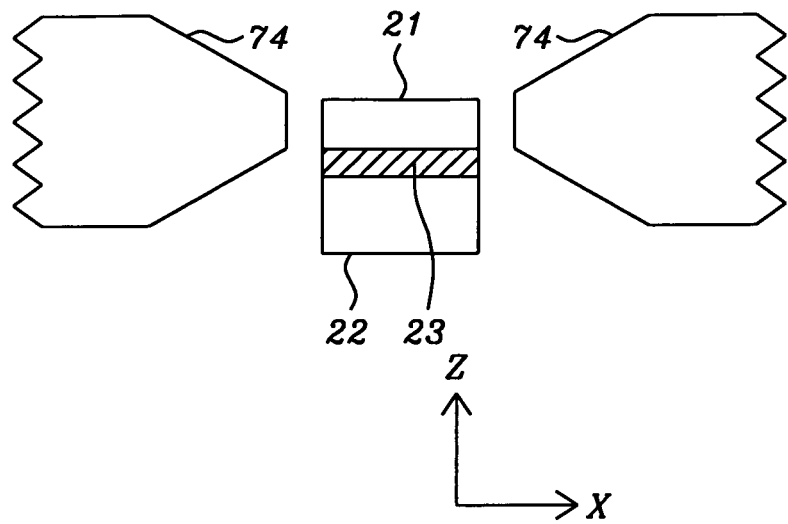
FIGS. 7A and B show an embodiment wherein the side stripe edges are symmetrically tapered and aligned with the free layer.
Figure 7B:
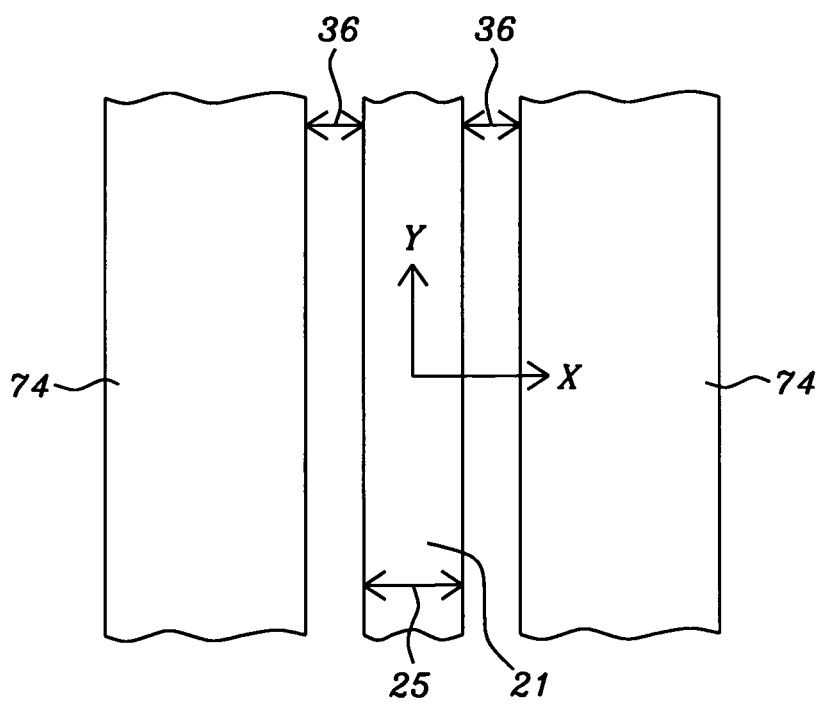

This embodiment, shown in FIGS. 7A&B, is the same as embodiment 1 except that pattern 74 has symmetrically tapered edges. The latter are aligned to be opposite the free layer and are thinnest at its point of closest proximity thereto, growing thicker (uniformly in both vertical directions) with distance from pattern 74, until reaching their regular thickness value. This tapered pattern 74 helps to concentrate flux into free layer 21, thereby increasing sensor sensitivity to an external field. The thickness of pattern 74 close to the free layer still satisfies the relationship of $M_{film}t_{film}>M_{free}t_{free}$. Spacing 36 between 74 and 21 is no greater than twice the larger of the free layer thickness and thickness of 74 at locations closest to the free layer.

What is claimed is:

1. A method of fabricating a magnetic sensor, comprising:
   depositing a layer of magneto-resistive (MR) device material;
   patterning said device layer to form a MR stripe having a bottom surface, a top layer that is a magnetically free layer having a first top surface, an aspect ratio of at least 5, a pair of opposing first edges that are equidistant from a center plane that bisects the MR stripe in a lengthwise direction, and a first thickness;
   depositing and patterning a layer of soft magnetic material to form a pair of flux absorbing stripes each having a second edge facing the center plane, a second top surface, and a second thickness;
   positioning said flux absorbing stripes so that the second edge of a first flux absorbing stripe is offset from one of the opposing first edges of the free layer along a second direction that is orthogonal to the center plane, and the second edge of a second flux absorbing stripe is offset from another of the opposing first edges of the free layer in a direction opposite to the second direction, with no part of said MR stripe being coplanar with any part of said flux absorbing stripes along any plane aligned perpendicular to the center plane, and with adjacent pairs of said first and second edges running parallel to each other, said adjacent edge pairs being separated from one another by a distance that is no greater than twice the larger of said first and second thicknesses, as measured from a one of the opposing first edges in a direction parallel to said free layer top surface;
   selecting values for said first and second thicknesses so that, at all times, a product of said soft magnetic stripe's magnetization times said second thickness is greater than a product of said free layer's magnetization times said first thickness; and
   thereby ensuring that said free layer undergoes uniform rotation when its direction of magnetization is reversed, that said free layer primarily comprises a single magnetic domain, and that field concentration and demagnetization cancellation by neighboring soft magnetic patterns are not limited by said free layer's properties whereby said free layer can be independently optimized to increase sensitivity for said MR sensor.

2. The method described in claim 1 wherein said first and second top surfaces have widths that are less than said free layer's exchange length.

3. The method of claim 1 wherein the first thickness equals the second thickness, and the soft magnetic stripe's magnetization is greater than the free layer's magnetization.

* * * * *